United States Patent
Bettencourt et al.

(10) Patent No.: US 9,799,645 B2
(45) Date of Patent: Oct. 24, 2017

(54) FIELD EFFECT TRANSISTOR (FET) STRUCTURE WITH INTEGRATED GATE CONNECTED DIODES

(71) Applicant: Raytheon Company, Waltham, MA (US)

(72) Inventors: John P. Bettencourt, Danvers, MA (US); Raghuveer Mallavarpu, Boxborough, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/947,197

(22) Filed: Nov. 20, 2015

(65) Prior Publication Data

US 2017/0148783 A1    May 25, 2017

(51) Int. Cl.
| | |
|---|---|
| H01L 29/66 | (2006.01) |
| H01L 27/06 | (2006.01) |
| H01L 29/872 | (2006.01) |
| H01L 21/8232 | (2006.01) |
| H01L 29/812 | (2006.01) |
| H01L 29/06 | (2006.01) |

(52) U.S. Cl.
CPC ...... H01L 27/0629 (2013.01); H01L 21/8232 (2013.01); H01L 29/0696 (2013.01); H01L 29/812 (2013.01); H01L 29/872 (2013.01)

(58) Field of Classification Search
CPC ............ H01L 27/0629; H01L 29/812; H01L 29/0696; H01L 29/872
See application file for complete search history.

(56) References Cited

U.S. PATENT DOCUMENTS

| | | |
|---|---|---|
| 5,111,253 A | 5/1992 | Korman et al. |
| 2005/0167742 A1 | 8/2005 | Challa et al. |
| 2011/0220978 A1 | 9/2011 | Ikeda et al. |
| 2012/0228632 A1* | 9/2012 | Takada ............... H01L 21/8213 257/77 |

(Continued)

OTHER PUBLICATIONS

Mrunal et al. Power Amplifier Linearization Using Diode On Voltage Nov. 24, 2011 Visvesvaraya National Institute of Technology, Nagpur, India.*

(Continued)

*Primary Examiner* — Dale E Page
*Assistant Examiner* — Wasiul Haider
(74) *Attorney, Agent, or Firm* — Daly, Crowley, Mofford & Durkee, LLP

(57) ABSTRACT

A structure having: a plurality of field effect transistors (FETs) connected between a common input and a common output, each one of the field effect transistors comprises: a source region, a drain region, and a gate electrode for controlling carriers through a channel region of a transistor region of the structure between the source region and the drain region; a plurality of diodes, each one of the diodes being associated with a corresponding one of the plurality of FETs, each one of the diodes having an electrode in Schottky contact with a diode region of the corresponding one of the FETs. The gate electrode and the diode electrode extend along parallel lines. The source region, the drain region, the channel region, and a diode region having therein the diode are disposed along a common line.

5 Claims, 9 Drawing Sheets

(56) References Cited

U.S. PATENT DOCUMENTS

2015/0137310 A1  5/2015  Fillmore et al.

OTHER PUBLICATIONS

Shouxuan Xie et al; "High Linearity GaN HEMT Power Amplifier With Pre-Linearization Gate Diode;" Department of ECE, UC Santa Barbara, IEEE Lester Eastman Conference on High Performance Devices, 2004; Aug. 4-6, 2004; pp. 223-228 (6 pages).
Notification of Transmittal of the International Search Report and the Written Opinion of the International Searching Authority, or the Declaration, PCT/US2016/060959, dated Jan. 31, 2017, 1 page.
International Search Report, PCT/US2016/060959, dated Jan. 31, 2017, 5 pages.
Written Opinion of the International Searching Authority, PCT/US2016/060959 dated Jan. 31, 2017, 8 pages.
Mrunal A. K., Makarand Shirasgaonkar, R.M. Patrikar, Power Amplifier Linearization Using a Diode, IEEE, May 16-19, 2006, pp. 173-176 4 pages.
Christopher B. Haskins, Diode Predistortion Linearization for Power Amplifier RFICs in Digital Radios, Apr. 17, 2000, 98 pages.

\* cited by examiner

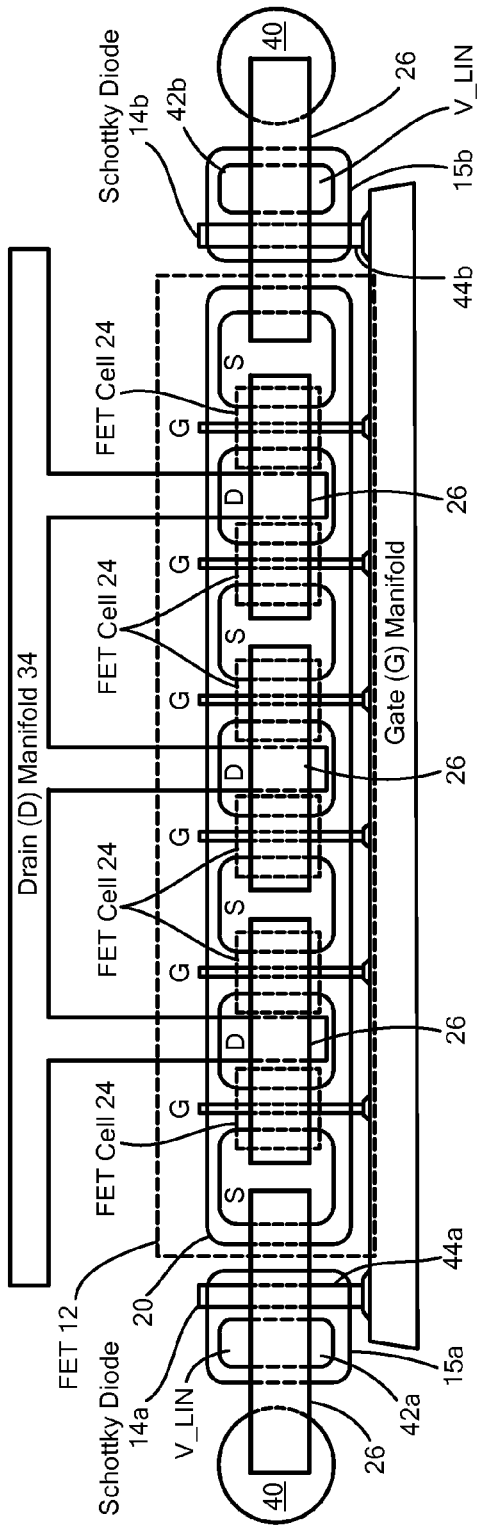
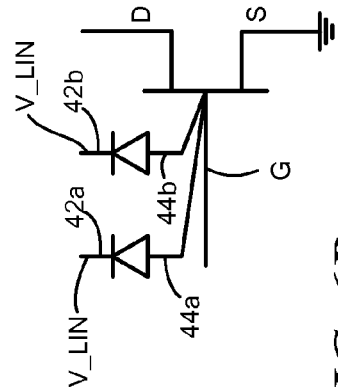
*FIG. 6A*
*FIG. 6B*

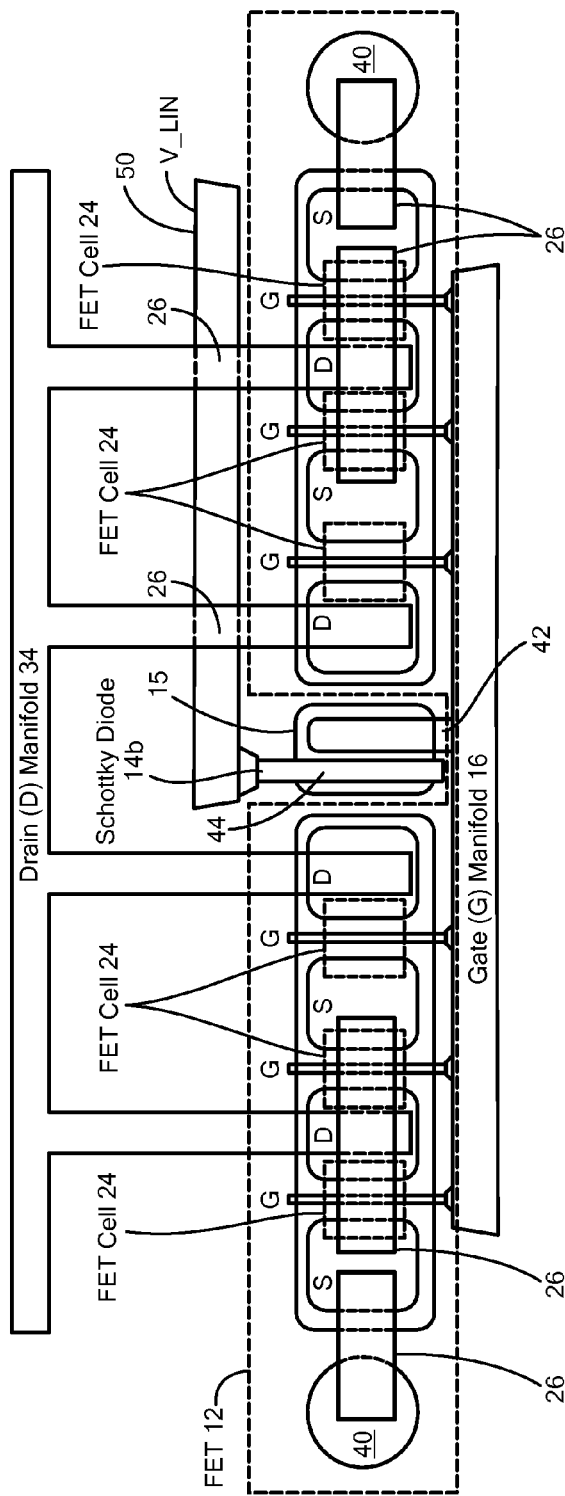
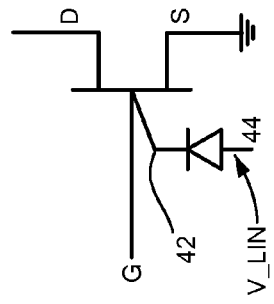
FIG. 7A
FIG. 7B

FIELD EFFECT TRANSISTOR (FET) STRUCTURE WITH INTEGRATED GATE CONNECTED DIODES

TECHNICAL FIELD

This disclosure relates generally to Field Effect Transistor amplifiers and more particularly to FET amplifiers having integrated diodes.

BACKGROUND

As is known in the art, an important requirement for a Radio Frequency (RF) Transistor Amplifier design is the linear operation of the amplifier. Common design or system techniques to enhance linearity performance are feedback, feedforward or pre-distortion. A common pre-distortion technique involves adding a linearizing diode circuit to the input of a FET amplifier, as shown in FIG. 1. Here the diode anode is connected near the gate of amplifier FET and the cathode is connected near the drain.

More particularly, during RF stimulus the FET gate to source capacitance (Cgs) will vary non-linearly, typically following a hyperbolic tangent curve, with gate voltage. A plot of this non-linear gate to source voltage (Vgs) vs. the capacitance in femtofarads (fF) between the gate and source (Cgs) relationship for a GaN HEMT is shown in FIG. 2. This non-linear varying capacitance degrades amplifier linear operation. An additional parallel capacitance (C diode) which varies inverse to the variation of Cgs with Vgs can be introduced at the input of the FET or amplifier to compensate for the above-described undesirable gate to source capacitance variation. This additional capacitance (C diode) is supplied by adding a linearizing diode at the input to the FET; the diode (C diode) providing an anode to cathode capacitance having the inverse non-linear relationship when the anode of the diode shares the gate node of the FET and the cathode of the diode share the drain node of the FET. Since the FET gate and diode anode nodes are shared, their respective non-linear capacitances add together resulting in a linear capacitance verses gate to source voltage at the gate node. This linearized input capacitance can result in a more linear amplifier operation, see Mural, A S K; Shirasgaonkar, M.; Patrikar, "Power Amplifier Linearization using a Diode", IEEE MELECON 2006, May 16-19, Benalmádena (Málaga), Spain and Akihro Ando, Yoichiro Takayama, Tsuyoshi Yoshida, Ryo Ishikawa, and Kazuhiko Honjo, A High-Efficiency Class-F GaN HEMT Power "Amplifier with a Diode Predistortion Linearizer", Microwave Conference, 2008, APMC 2008. Asia-Pacific.

It is also known in the art, a plurality of FETs may be arranged as a Monolithic Microwave Integrated Circuit (MMIC) chip power amplifier, as shown in FIG. 3A. Here, the RF input signal is fed to an input matching network (IMN), the output of which is fed equally to the input of each one of the plurality of plural cell FETs. The outputs of each one of the plurality of plural cell FETs are combined and fed to an output matching network (OMN), as shown. The linearizing diode, described above, is connected to the input of the amplifier either "off" the MMIC chip, as shown in FIG. 3A, or "on" the MMIC chip (FIG. 3B) as described in a paper entitled "High linearity GaN HEMT power amplifier with pre-linearization gate diode", Shouxuan Xie, Vamsi Paidi, Sten Heikman, Alessandro Chini, Umesh K. Mishra, Mark J. W. Rodwell and Stephen I. Long, published in High Performance Devices, 2004. Proceedings IEEE Lester Eastman Conference, 4-6 Aug. 2004, pages 223-228.

As is also known in the art, one type of FET includes a plurality of linearly arranged FET cells (herein sometimes referred to as a plural cell FET) as shown in FIGS. 4A and 4B on a semiconductor, here a GaN, mesa hetero-structure, as shown, which provides an active region for the FET. Here, ends of gate finger-like electrodes are connected to a common gate manifold contact pad. Each gate finger-like electrodes (G) controls a flow of carriers in a channel region between a source region (S) and a drain region (D). Drain and source electrodes are in ohmic contact with the FET drain and source regions; and the gate finger-like electrodes (G) are in Schottky contact with the gate regions The drain electrodes have ends thereof connected to a drain manifold contact and the source regions are interconnected by air bridges as shown. The end ones of the source region (S) are connected to a ground plane conductor on the bottom surface of a substrate with electrically conductive vias, as shown. However, alternatively, each one of the source regions (S) may be connected to the ground plane on the bottom surface of the substrate as shown in FIG. 4C or alternatively, the vias and ground plane may be removed as with a coplanar wave guide (CPW) transmission structure where the ground plane, not shown, is on the upper surface of the substrate, (FIG. 4D).

SUMMARY

In accordance with the disclosure, a structure is provided having: a plurality of field effect transistors (FETs) connected between a common input and a common output. Each one of the field effect transistors comprises: a source region, a drain region, and a gate electrode for controlling carriers through a channel region of a transistor region of the structure between the source region and the drain region; and a plurality of diodes, each one of the diodes being associated with a corresponding one of the plurality of FETs, each one of the diodes having an electrode in Schottky contact with a diode region of the corresponding one of the FETs.

In one embodiment, each one of the diodes is disposed proximate to the corresponding one of the FETs.

In one embodiment, a structure is provided having: a plurality of field effect transistors (FETs) connected between a common input and a common output, each one of the field effect transistors comprising: a plurality of field effect transistor cells, each one of the FET cells comprising: a source region, a drain region, and a gate electrode for controlling carriers through a channel region of a transistor region of the structure between the source region and the drain region; and plurality of diodes, each one of the diodes being associated with a corresponding one of the plurality of FETs, each one of the diodes having an electrode in Schottky contact with a diode region of the corresponding one of the FETs.

In one embodiment, a structure is provided having a plurality of field effect transistors (FETs) connected between a common input and a common output. Each one of the field effect transistors comprises a plurality of field effect transistor cells. Each one of the FET cells comprises: a source region, a drain region, and a gate electrode for controlling carriers through a channel region of a transistor region of the structure between the source region and the drain region; and a diode having an electrode in Schottky contact with a diode region of the FET cell.

With such an arrangement, rather than have one linearizing diode at the input of the amplifier to compensate for the Cgs vs. Vgs variation of all of the FETs in the amplifier, in accordance with the present disclosure, each one of the FETs has its own, associated linearizing diode. Thus, each one of the linearizing diodes is associated with, and is proximal to, a corresponding, individual one, of the FETs that requires Cgs vs. Vgs variation compensation.

In one embodiment, a structure is provided having: a field effect transistor having a source region, a drain region, and a gate electrode for controlling carriers through a channel region of a transistor region of the structure between the source region and the drain region; and a diode having an electrode in Schottky contact with a diode region of the structure. The gate electrode and the diode electrode extend along parallel lines.

In one embodiment, a structure is provided having a field effect transistor comprising: a source region; a drain region; and a gate electrode for controlling carriers through a channel region of a transistor region of the structure between the source region and the drain region. A diode is provided having an electrode in Schottky contact with a diode region of the structure. The source region, the drain region, the gate electrode, and the diode region are disposed along a common line.

In one embodiment, the gate electrode and the diode electrode extend along parallel lines and wherein the common line is perpendicular to the parallel lines.

In one embodiment, a structure is provided having: a plurality of field effect transistor cells, each one of the cells comprising: a source region, a drain region, and a gate electrode for controlling carriers through a channel region of a semiconductor region of the structure between the source region and the drain region, wherein the gate electrodes of the cells are parallel one to another, and wherein the gate electrodes have ends thereof connected to a common gate manifold pad. A diode is provided having: a first electrode in Schottky contact with a different portion of the semiconductor region to provide a cathode for the diode, the diode region being disposed between the drain region of one of the cells and the drain region of an adjacent one of the cells, said cathode electrode being electrically connected to the drain region of said one of the cells and the drain region of an said adjacent one of the cells through portions of the semiconductor region between said drain region of one of the cells and said drain region of an adjacent one of the cells; and a second electrode providing an anode for the diode being connected to the gate pad.

In one embodiment, the second electrode is disposed along a line parallel to the gate electrodes.

In one embodiment, a method is provided for forming a field effect transistor and a diode connected to the field effect transistor comprising forming a gate electrode of the field effect transistor in Schottky contact with a first semiconductor region on a substrate and a cathode electrode of the diode in Schottky contact with a second region of a semiconductor on the substrate during a common process step.

In one embodiment, a structure is provided having a plurality of field effect transistor cells. A diode is disposed between a pair of adjacent ones of the cells.

In one embodiment, the structure includes a semiconductor wherein one of the cells has a drain region in the semiconductor, a source region in the semiconductor and gate electrode in Schottky contact with a portion of a semiconductor between the source region and the drain region; and wherein the diode has a cathode in Schottky contact with a portion of the semiconductor adjacent to the drain region and an anode connected to the gate.

In one embodiment, the gate has a predetermined width and the diode cathode has a predetermined width greater than the predetermined width of the gate.

In one embodiment, the gate has a predetermined width and the diode cathode has a predetermined width at least an order of magnitude greater than the predetermined width of the gate.

The inventors have recognized that the linearizing Schottky diode capacitance per unit area is smaller relative to the unit area capacitance Cgs of the FET. Thus, the anode electrode of the diode, which is in Schottky contact with the semiconductor is much wider than the width of the gate finger-like electrodes, which are also in Schottky contact with the semiconductor, for example 10 to 100 times greater. Therefore, the diode provides a sufficiently large non-linear capacitance between the gate and the drain to completely balance out the Cgs variation with Vgs.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 6A is a simplified top view of a the FET and integrated linearization diode according to another embodiment of the disclosure;

FIG. 6B is a schematic diagram of the FET and integrated linearization diode of FIG. 5A;

FIG. 7A is a simplified top view of a the FET and integrated linearization diode according to still another embodiment of the disclosure; and FIG. 7B is a schematic diagram of the FET and integrated linearization diode of FIG. 7A.

Like reference symbols in the various drawings indicate like elements.

DETAILED DESCRIPTION

Figure 5:
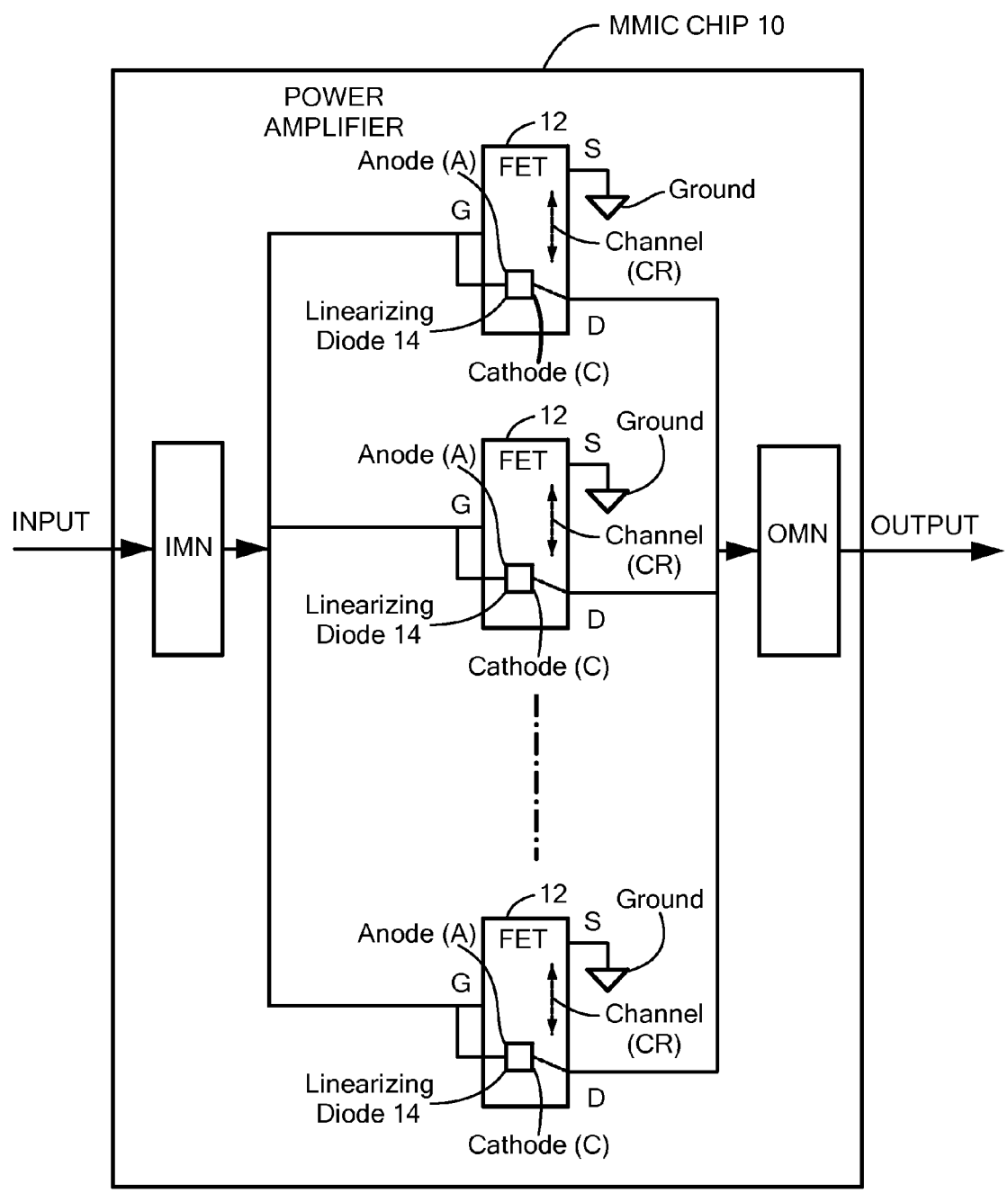
FIG. 5 is a block diagram of a FET power amplifier having a plurality of the FETs, each one of the FETs having an integrated linearizing diode according to the disclosure.

Referring now to FIG. 5 a block diagram is shown of a structure, here a FET MMIC chip power amplifier 10 having: a plurality of field effect transistors FETs 12. Each one of the FETs 12 is identical in construction, an exemplary one thereof being shown in FIGS. 5A and 5B and being described in more detail below. Suffice it to say here that each one of the FETs 12 is associated with it its own linearizing diode 14 connected to the gate electrode G and the drain region (D) of the FET 12. Thus each one of the diodes 14 is associated with, and is proximal to, a corresponding, individual one, of the FETs 12 that requires Cgs vs. Vgs variation compensation.

More particularly, the amplifier 10 includes a MMIC chip structure having the plurality of FETs 12 connected between to a common input through an input impedance matching network (IMN) and a common output through an output impedance matching network (OMN), as shown. Each one of the field effect transistors 12 comprises: a source region (S), a drain region (D), and a gate electrode (G) for controlling carriers through a channel region (CR) of a transistor region of the structure between the source region (S) and the drain region (D). As noted above, each one of the FETs 12 is associated with it its own linearizing diode 14 connected to the gate electrode G and the drain region (D) of the FET 12. More particularly, the diode 14 has an electrode, here the anode (A) of the diode 14, in Schottky contact with a diode region 15 of the FET 12. Here, each one of the FETs 12 is, here in this example, a plural cell FET, an exemplary one thereof being shown in FIGS. 5A and 5B.

Figure 5A:
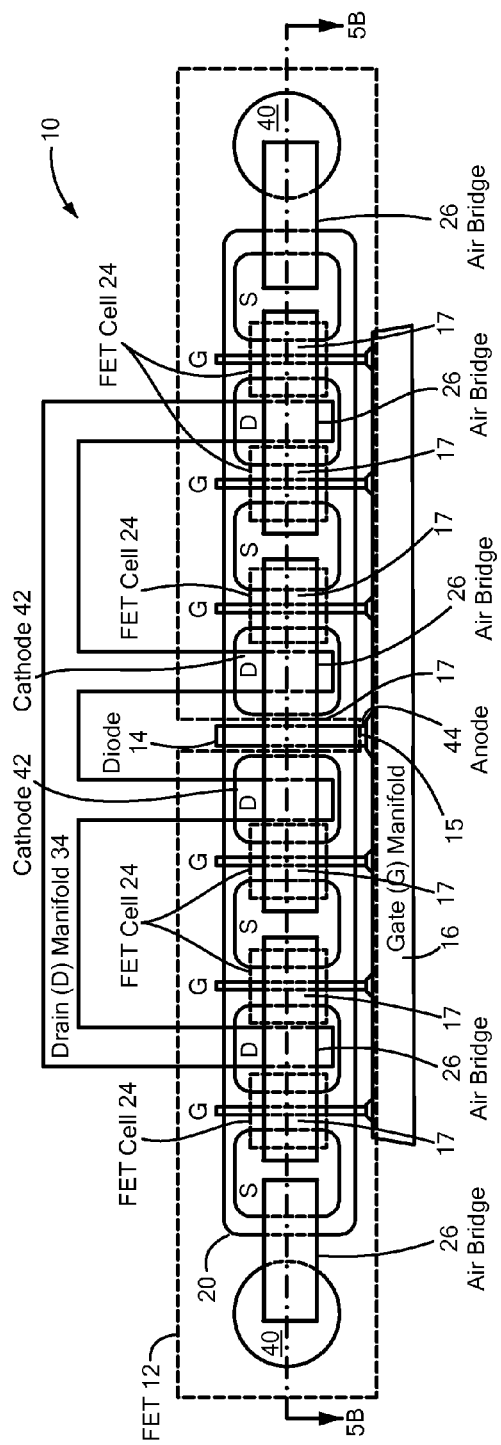
FIG. 5A is as top view of a FET and integrated linearization diode according to the disclosure.
Figure 5B:
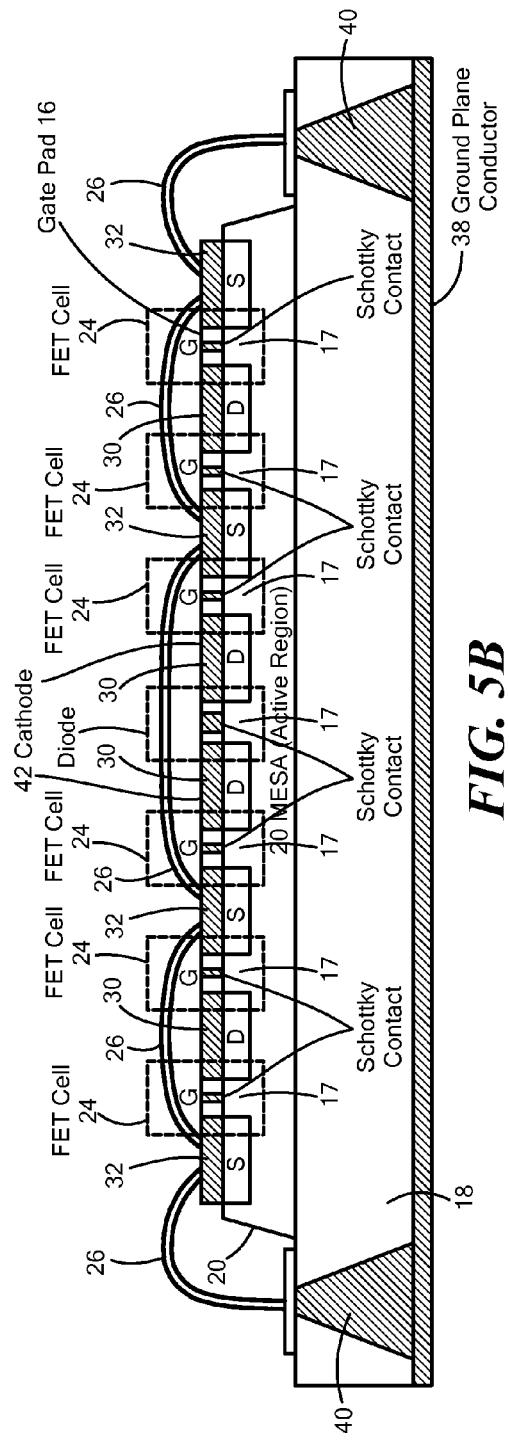
FIG. 5B is a cross sectional view of the FET and integrated linearization diode of FIG. 5A according to the disclosure, such cross section being taken along line 5B-5B in FIG. 5A.

Thus, referring now to FIGS. 5A and 5B, an exemplary one of the plural cell FETs 24 is shown along with its associated diode 14 connected between the gate manifold contact pad 16 of the FET 12 and a drain region (D) of the FET 12. More particularly, here the MMIC chip structure includes a substrate 18 having a Group III-V, for example, GaN, semiconductor mesa heterostructure 20 formed on the upper surface of the substrate 18. Here, for example, the mesa structure 20 includes a connectivity to provide an active region for the FET 12. Still more particularly, FET 12 includes a plurality of linearly arranged FET cells 24, here, for example, six, cells 24 interconnected with air bridges 26 as shown. Here, ends of gate finger-like electrodes (G) are connected to the common gate manifold contact pad 16. Each gate finger-like electrodes (G) controls a flow of carriers in a channel region (CR), here indicated by numeral 17, of the active region of the mesa structure 20 between a source region (S) and a drain region (D) of the corresponding one of the cell 24. Drain electrodes 30 are in ohmic-contact with the drain regions (D) of the semiconductor mesa hetero-structure 20; the source electrodes 32 are in ohmic contact with the source regions (S) of the semiconductor mesa hetero-structure 20, and the gate finger-like electrodes (G) are in Schottky contact with the gate regions (G) of the semiconductor mesa hetero-structure 20. The drain electrodes 30 have ends thereof connected to a drain manifold contact pad 34 and the source regions (S) are interconnected by air bridges 26 as shown. In this example, the source regions (S) at the ends of the linear array are also connected to a ground plane conductor 38 on the bottom surface of a substrate 18 with electrically conductive vias 40, as shown.

Figure 1:
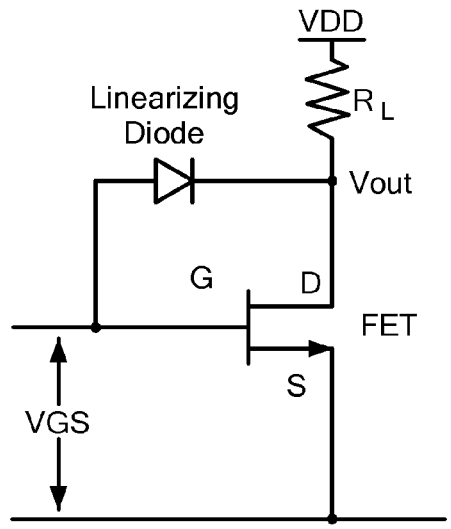
FIG. 1 is a schematic diagram of a Field Effect Transistor (FET) coupled to a linearizing diode according to the PRIOR ART.
Figure 2:
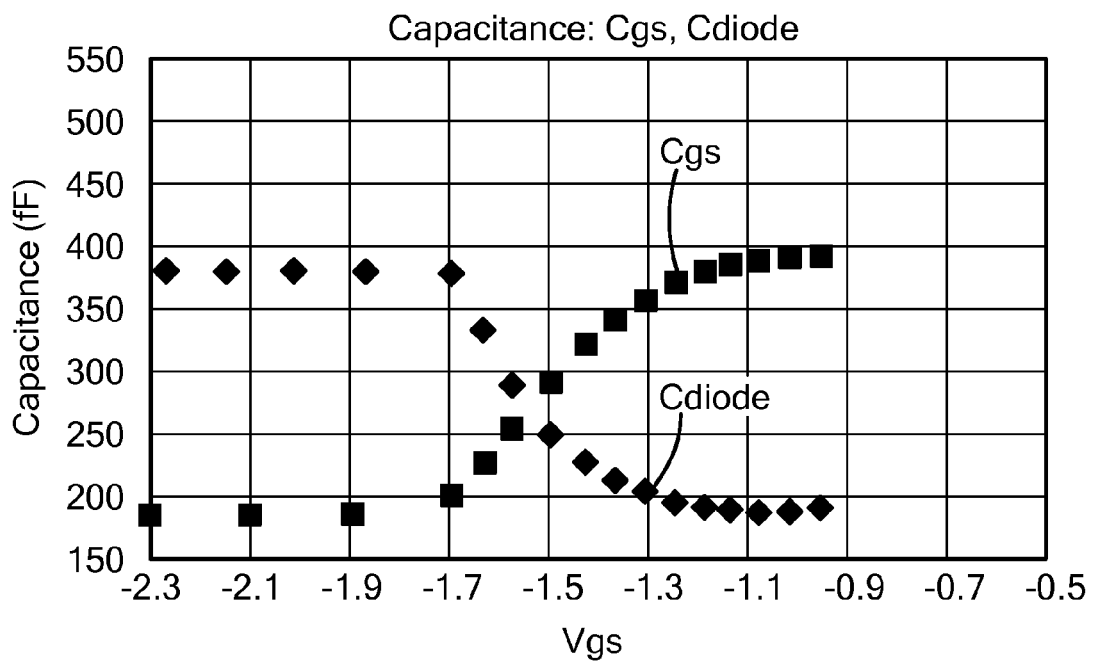
FIG. 2 is a set of curves, one showing the non-linear Cgs and Cdiode (linearizing diode capacitance) vs Vgs for a Gallium Nitride FET according to the PRIOR ART.
Figures 3A, 3B:
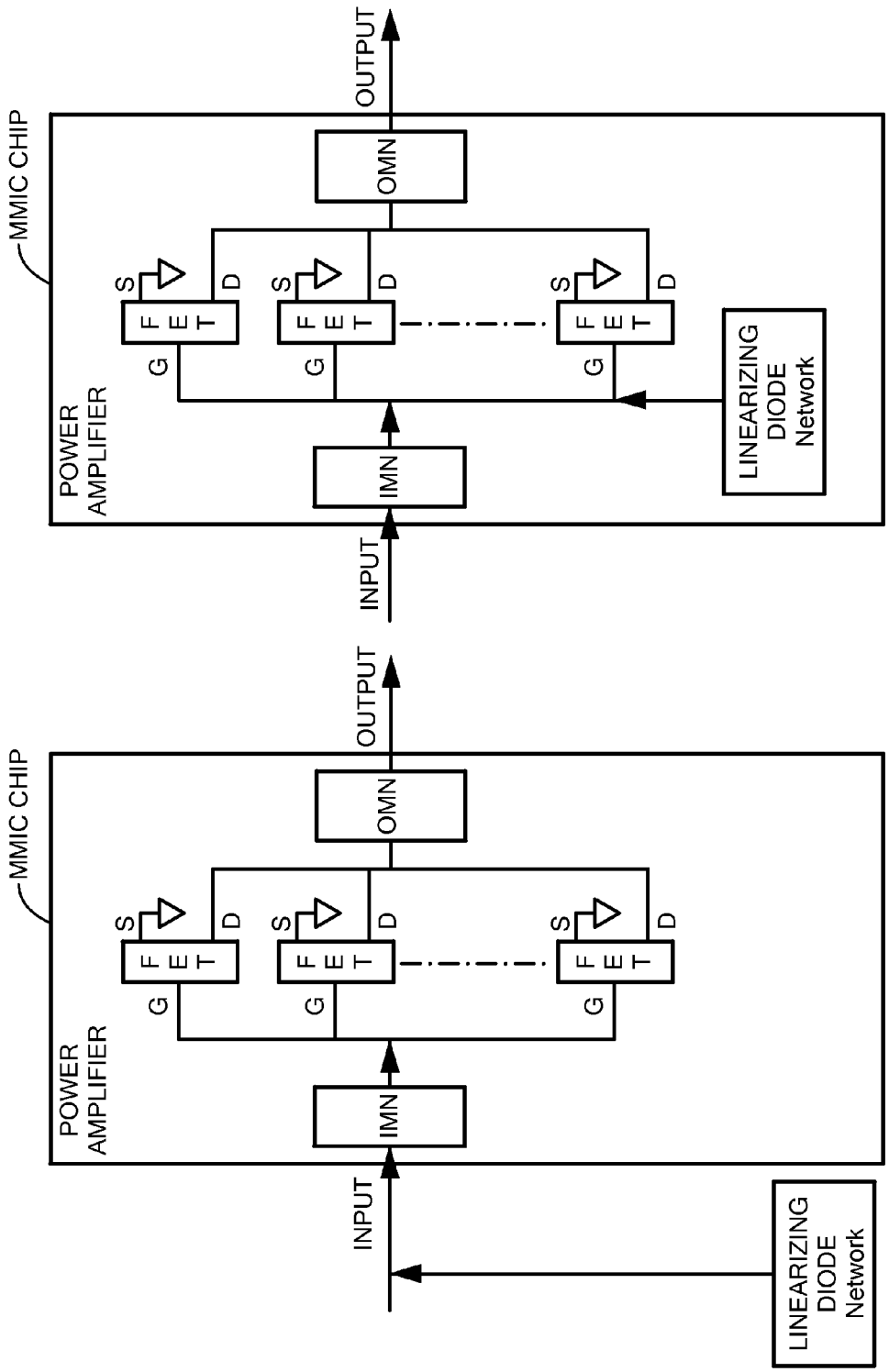
FIGS. 3A and 3B are block diagrams of a FET power amplifier having a plurality of FETs with a linearizing diode according to the PRIOR ART.
Figure 4A:
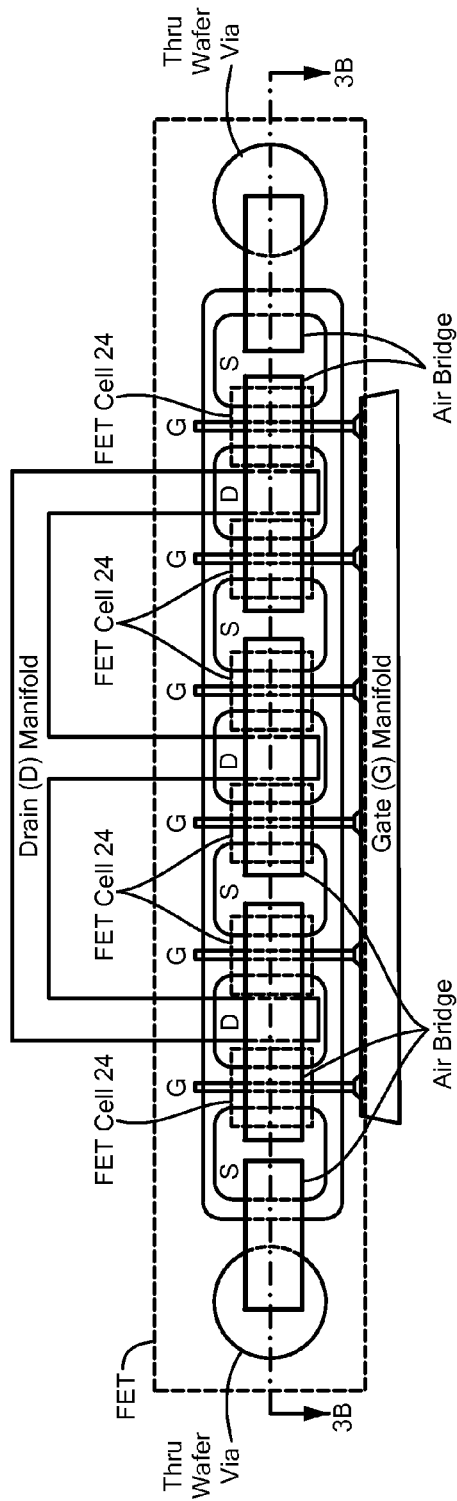
FIG. 4A is a top view of a plural cell FET according to the PRIOR ART.
Figure 4B:
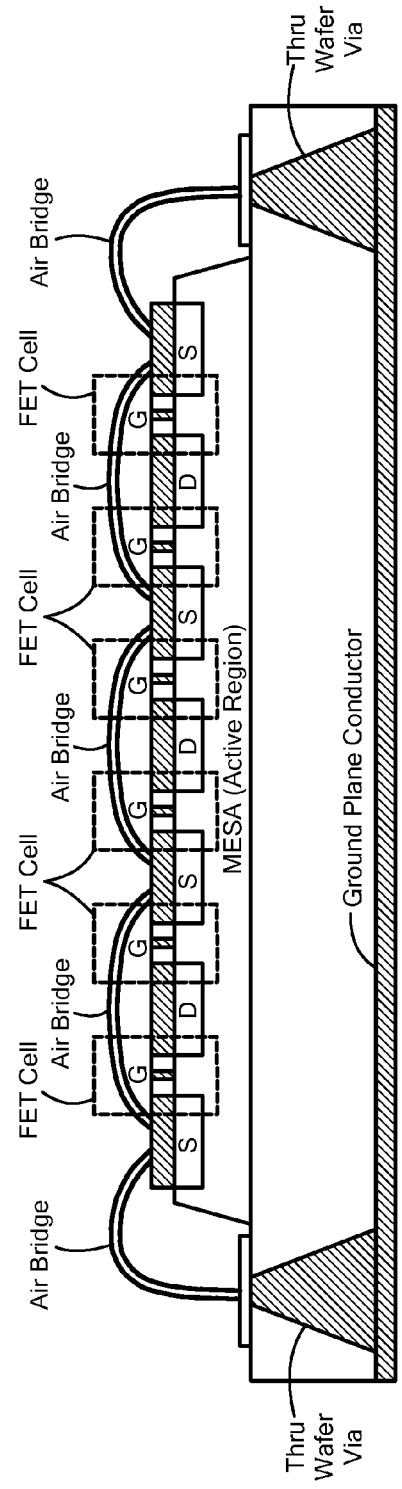
FIG. 4B is a cross sectional view of the plural cell FET of FIG. 4A, such cross section being taken along line 4B-4B in FIG. 4A according to the PRIOR ART.

The diode 14 has a cathode electrode 42 in ohmic contact with a different portion of the of the semiconductor mesa hetero-structure 20, as diode region 15, to provide a cathode for the diode 14. The ohmic contact for the cathode elect ride 44 is formed at the same time as the ohmic contacts for the source and drain electrodes. That is the diode 14 is formed in the mesa 20 between the drain regions D of a pair of adjacent cells 24, here between the central pair of adjacent cells 24. More particularly, the cathode electrode (C), here indicated by numeral 42, of the diode 14 is electrically connected to the drain region D of one of the adjacent cells 24 and the drain region D of the other one of the adjacent cells through portions of the semiconductor region of the mesa 20 between the drain regions D of the adjacent cells 24. A anode electrode 44 of the diode 14 is in Schottky contact with the semiconductor mesa hetero-structure 20 and provides an anode (A) for the diode 14 and is connected to the gate manifold contact pad 16. Thus, the FET gate and the diode anode share a common node. The anode electrode 44 of the diode 14 is disposed along a line parallel to the gate finger-like electrodes G. The source regions, S, the drain regions, D, the channel regions 17, and the diode region 15 are disposed along a common line or direction, here a horizontal direction in FIG. 4A. The gate finger-like electrodes G and the cathode electrode 42 extend along parallel lines and wherein the common line is perpendicular to the parallel lines. Thus, the finger-like gate electrodes G and the cathode electrode 42 are parallel and are in the vertical direction in FIG. 4A.

Referring again to FIGS. 5A and 5B, it is noted that the anode electrode 44 of the diode 14, which is in Schottky contact with the with the semiconductor mesa hetero-structure 20, is much wider than the width of the gate finger-like electrodes G, which are also with the semiconductor mesa hetero-structure 20; here for example 10 to 100 times greater. Therefore, the diode 14 therefore provides a sufficiently large non-linear capacitance between the gate manifold contact pad 14 of the FET 12 and the drain manifold contact pad 34 of the FET 12 to completely balance out the larger Cgs variation with Vgs. Thus, the inventors have made the width of the anode 44 of the diode 14, and hence its anode to cathode capacitance sufficiently large to completely compensate for the gate to source capacitance of the FET. It is also noted that while the width of the anode electrode 44 of the diode 14 and the width of the finger-like gate electrodes G are different, the anode electrode 44 and the finger-like gate electrodes G are formed during the same, common, process step (the anode electrode 44 and the finger-like gate electrodes G are formed concurrently) and thus is formed integrally with the FET 12.

Referring now to FIGS. 6A and 6B, another embodiment of the disclosure is shown. Here, the linearizing diodes 14a, 14b are placed at the ends of the FET 12 and are adapted for the cathode electrodes 42a, 42b of the diodes 14a, 14b to be connected to something other than the drain manifold contact pad 34 of the FET. Here, for example a separate cathode bias voltage called V_LIN that is independent of the transistor drain. The structure is shown schematically in FIG. 6B Here the diodes 14a, 14b are shown formed in semiconductor diode regions 15a, 15b, respectively, spaced from the mesa of the semiconductor FET region having formed therein the FET. It is noted that each of the diodes 14a, 14b have their anode electrode 44a, 44b, which make Schottky contact with of semiconductor diode regions 15a, 15b, respectively, connected to the gate manifold contact pad 16 and have their cathodes electrodes 42*a*, 42*b* making ohmic contact to the semiconductor diode regions 15*a*, 15*b*, respectively. It is noted that here the anode electrodes 44*a*, 44*b* are connected to the gate bus 16; thus, here the FET gate and the diode cathode share a common node. It is noted that the cathodes 42*a*, 42*b* can be connected to an independent voltage such as a linearizing voltage V_LIN. Here again, the diode anode electrodes 44*a*, 44*b* and the finger-like gate electrodes G are formed during the same process step. Thus, the diode anode electrode 44*a*, 44*b* and the finger-like gate electrodes G are formed concurrently. It is noted that the drain regions (D) are connected to the drain (D) manifold pad 34 through drain fingers that pass under the air-bridges 26 connecting the source regions (S).

Figure 7:
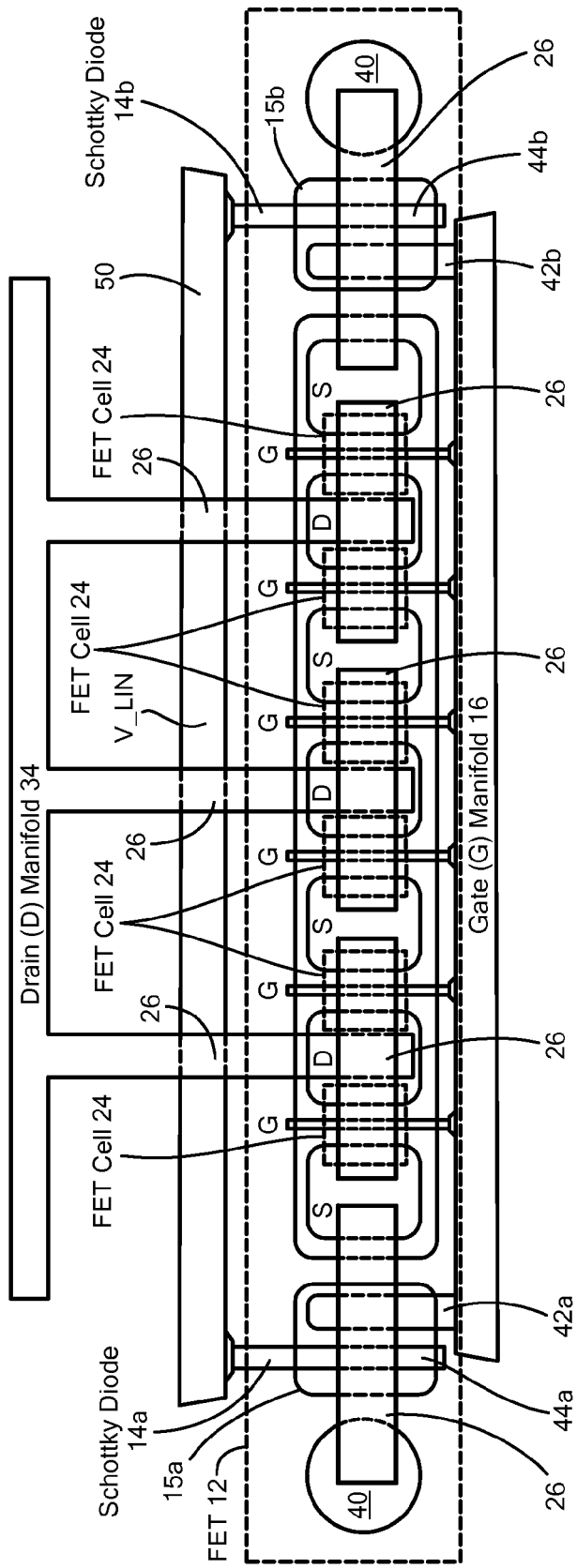
FIG. 7 is a simplified top view of a the FET and integrated linearization diode according to still another embodiment of the disclosure, such top view having been simplified for purposes of illustration by removing air bridges and a drain manifold contact pad of the FET, a schematic diagram being shown in FIG. 7B.

Referring now to FIG. 7, the linearizing diodes 14*a*, 14*b* are placed at the ends of the FET 12 and are adapted for the anodes electrodes 44*a*, 44*b* of the diodes 14*a*, 14*b* to be connected to something other than the gate of the FET; for example, an independent linearizing network which supplies a voltage, here V_LIN connected to a voltage bus 50. Here the diodes 14*a*, 14*b* are shown formed in semiconductor diode regions 15*a*, 15*b*, respectively, again, as in FIGS. 5A and 5B spaced from the semiconductor FET region (mesa 20) having formed therein the FET 14. It is noted that each of the diodes 14*a*, 14*b* have their anode electrodes 44*a*, 44*b*, which make Schottky contact to the semiconductor diode regions 15*a*, 15*b*, respectively, connected to a bus 50 adapted for connection to the linearizing network supplying voltage V_LIN and have their cathode electrodes 42*a*, 42*b* making ohmic contact to the semiconductor diode regions 15*a*, 15*b*, respectively. Here, the cathode electrodes 42*a*, 42*b* of the diodes are connected to the gate bus 16; thus here the FET gate and diode cathode share a common node. It is noted that the anode electrodes 44*a*, 44*b* and the finger-like gate electrodes G are formed during the same process step. It is noted that the drain regions (D) are connected to the drain (D) manifold pad 34 through drain fingers that pass over the voltage bus 50 and under the air-bridges 26 connecting the source regions (S).

Referring now to FIGS. 7A and 7B, a diode 14 is formed in a diode region 15 between a pair of the cells 14 of the FET. Here the anode electrode 44 of the diode 14 is in Schottky contact with a semiconductor of diode region 15 and is connected to something other than the gate manifold contact pad of the FET; for example, an independent linearizing network providing voltage V_LIN through a bus 50. It is noted that the anode electrodes 44, makes Schottky contact to the semiconductor diode region 15. It is noted that here, the cathode electrode 42 is connected to the gate bus 16. It is again noted that the anode electrode 44 and the finger-like gate electrodes G are formed during the same process step. A schematic diagram of the structure shown in FIG. 7A is shown in FIG. 7B. It is noted that the drain regions (D) are connected to the drain (D) manifold pad 34 through drain fingers that pass over the voltage bus 50 and under the air-bridges 26 connecting the source regions (S).

Figure 4C:
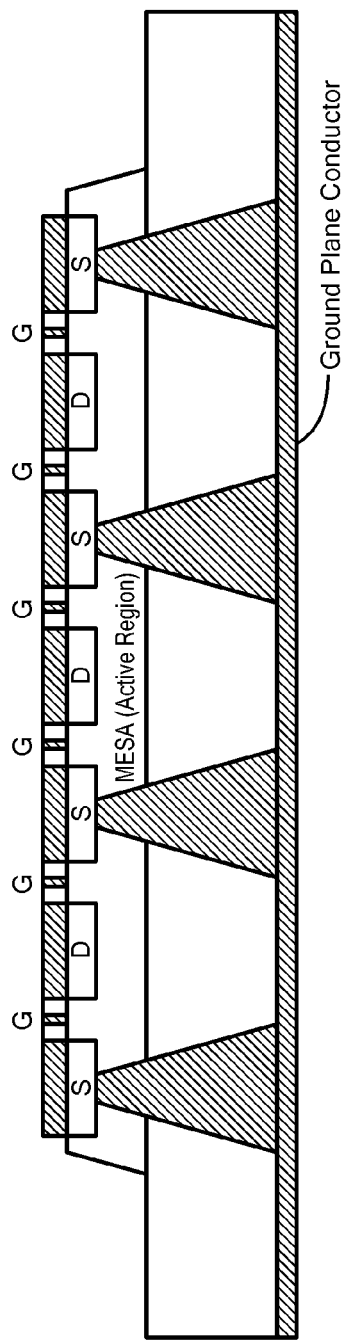
FIG. 4C is a cross sectional view of the plural cell FET according to the PRIOR ART.
Figure 4D:
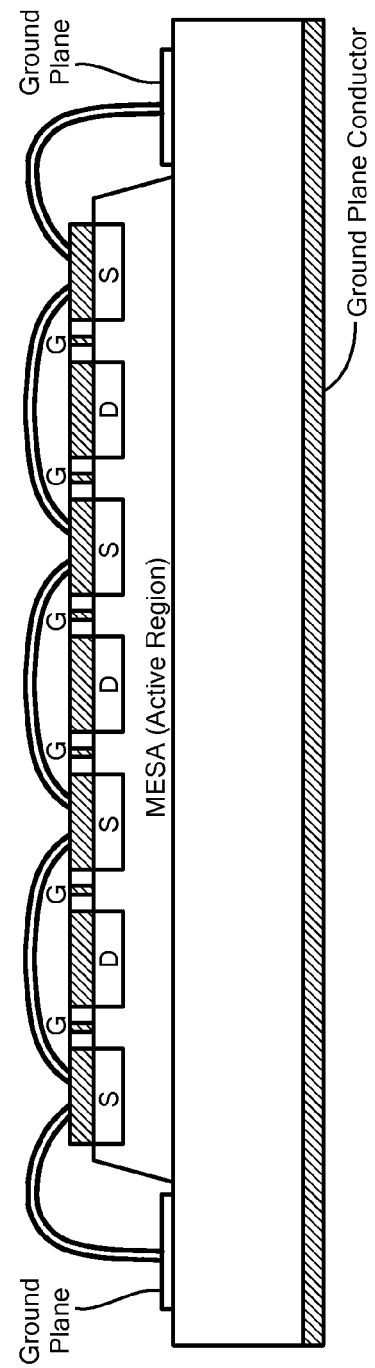
FIG. 4D is a cross sectional view of the plural cell FET according to the PRIOR ART.

A number of embodiments of the disclosure have been described. For example, the FET may be connected to the ground plane on the bottom surface of the substrate as shown in FIG. 4C or alternatively, the vias and ground plane may be removed as with a coplanar wave guide (CPW) transmission structure where the ground plane, not shown, is on the upper surface of the substrate, as shown in FIG. 4D. Nevertheless, it will be understood that various modifications may be made without departing from the spirit and scope of the disclosure. Accordingly, other embodiments are within the scope of the following claims.

What is claimed is:

1. A structure, comprising:
    a plurality of field effect transistors (FETs) connected between a common input and a common output, each one of the field effect transistors comprises: a source region, a drain region, and a gate electrode for controlling carriers through a channel region of a transistor region of the structure between the source region and the drain region;
    a plurality of diodes, each one of the diodes being associated with a corresponding one of the plurality of FETs, each one of the diodes having an electrode in Schottky contact with a diode region of the corresponding one of the FETs;
    wherein each one of the diodes has an electrode in Schottky contact with a diode region of the structure; and
    wherein the gate electrode and a diode electrode extend along parallel lines.

2. A structure, comprising:
    a plurality of field effect transistors (FETs) connected between a common input and a common output, each one of the field effect transistors comprises: a source region, a drain region, and a gate electrode for controlling carriers through a channel region of a transistor region of the structure between the source region and the drain region;
    a plurality of diodes, each one of the diodes being associated with a corresponding one of the plurality of FETs, each one of the diodes having an electrode in Schottky contact with a diode region of the corresponding one of the FETs; and
    wherein the source region, the drain region, the channel region, and the diode region are disposed along a common line.

3. The structure recited in claim 2 wherein the gate electrode and the diode electrode extend along parallel lines and wherein the common line is perpendicular to the parallel lines.

4. A structure, comprising:
    a plurality of field effect transistors (FETs) connected between a common input and a common output, each one of the field effect transistors comprises: a source region, a drain region, and a gate electrode for controlling carriers through a channel region of a transistor region of the structure between the source region and the drain region;
    a plurality of diodes, each one of the diodes being associated with a corresponding one of the plurality of FETs, each one of the diodes having an electrode in Schottky contact with a diode region of the corresponding one of the FETs;
    wherein each one of the diodes is disposed proximate to the corresponding one of the FETs; and
    wherein the source region, the drain region, the channel region, and the diode region are disposed along a common line.

5. A structure, comprising:
    a plurality of field effect transistors (FETs) connected between a common input and a common output, each one of the field effect transistors comprises: a source region, a drain region, and a gate electrode for controlling carriers through a channel region of a transistor region of the structure between the source region and the drain region;

a plurality of diodes, each one of the diodes being associated with a corresponding one of the plurality of FETs, each one of the diodes having an electrode in Schottky contact with a diode region of the corresponding one of the FETs, each one of the plurality of diodes providing a non-linear capacitance versus gate region to source region voltage at the gate region.

* * * * *